United States Patent

Schnoor et al.

[11] Patent Number: 5,841,639
[45] Date of Patent: Nov. 24, 1998

[54] EXPANSION MODULE FOR A COMMUNCATIONS NETWORK

[75] Inventors: William John Schnoor, Hummelstown; Bret Allen Matz, Mechanicsburg, both of Pa.; Nathan Ross Fritts, Wake Forest, N.C.

[73] Assignee: The Whitaker Corporation, Wilmington, Del.

[21] Appl. No.: 609,142

[22] Filed: Feb. 29, 1996

Related U.S. Application Data

[60] Provisional application No. 60/005,866, Oct. 26, 1995.

[51] Int. Cl.$^6$ .................................................. H05K 7/14
[52] U.S. Cl. ........................ 361/796; 361/683; 361/741; 361/752; 361/731
[58] Field of Search ................................ 361/683–685, 361/726–727, 728, 729–731, 735–736, 740–741, 752, 756, 759, 789, 792, 796, 801, 802, 810; 174/50; 381/81

[56] References Cited

U.S. PATENT DOCUMENTS

| | | | |
|---|---|---|---|
| 4,338,671 | 7/1982 | Hall et al. | 361/383 |
| 4,401,351 | 8/1983 | Record | 339/17 |
| 4,423,468 | 12/1983 | Gatto et al. | 361/404 |
| 4,530,066 | 7/1985 | Ohwaki et al. | 364/708 |
| 4,558,914 | 12/1985 | Prager et al. | 339/75 R |
| 4,688,864 | 8/1987 | Sorel | 439/74 |
| 4,734,874 | 3/1988 | Hwang et al. | 364/708 |
| 4,858,070 | 8/1989 | Baron et al. | 361/384 |
| 4,866,215 | 9/1989 | Muller et al. | 174/50 |
| 5,311,397 | 5/1994 | Harshberger et al. | 361/683 |
| 5,440,644 | 8/1995 | Farinelli et al. | 381/81 |

FOREIGN PATENT DOCUMENTS

| | | | |
|---|---|---|---|
| 0 576 344 A1 | 12/1993 | European Pat. Off. | H05K 5/00 |
| WO 88/08662 | 11/1988 | WIPO | H05K 7/20 |

*Primary Examiner*—Leo P. Picard
*Assistant Examiner*—Anthony Dinkins

[57] ABSTRACT

An expansion module for connecting additional communication ports (64) to a hub (10) of a communications network, an enclosure containing additional communication ports (64) on a motherboard (43), a hub receiving portion on an exterior of the enclosure, the hub receiving portion being adapted for mounting to a hub (10) of a communications network, a hub receiving opening (37) in the enclosure, a mating interconnection board (121) connected to the motherboard (43) and facing the hub receiving opening (37), the mating interconnection board (121) being adapted for electrical connection with a card edge connector (45) on the hub (10).

22 Claims, 9 Drawing Sheets

EXPANSION MODULE FOR A COMMUNCATIONS NETWORK

CROSS REFERENCE TO RELATED APPLICATION

This application claims the benefit under 35 U.S.C. ¶119 (e) of U.S. provisional application No. 60/005,866, filed Oct. 26, 1995.

FIELD OF THE INVENTION

The invention relates to an expansion module for a communications network, and more particularly, to an expansion module for adding additional communication ports to a network hub of a communications network.

BACKGROUND OF THE INVENTION

According to U.S. Pat. No. 4,858,070, a known interconnection mechanism is constructed with multiple communication ports on respective motherboards of duplicate construction. Post headers are on respective motherboards to connect the motherboards to one another in a stacked arrangement. The motherboards are duplicates of one another without active circuitry on the motherboards. The active circuitry is embodied in a cassette. The motherboards are contained in C-shaped enclosures that receive respective cassettes containing the active circuitry. For example, each cassette contains active circuitry for operating a disk drive. Cassette connectors on respective motherboards connect the communication ports on the motherboards to respective cassettes.

The known interconnection mechanism, according to the patent, requires active circuitry in a cassette that serves solely one motherboard. Each motherboard has a fixed number of communication ports. When additional communication ports are desired, the active circuitry must be duplicated in an additional cassette to serve the additional communication ports on another motherboard. Consequently, the communication ports on one motherboard are unable to be connected to the same active circuitry that serves a different motherboard.

The known interconnection mechanism requires the expense of additional active circuitry whenever the system is upgraded or expanded with additional communication ports.

Various office equipment, such as multiple computers, peripheral devices and automated factory machines, are located at various work sites in a building. A communications network comprises, apparatus in the form of wiring and associated electronic apparatus that link together the various office equipment for the purpose of communicating with each other by encoded electronic messages that are routed over the network. The electronic apparatus includes, electronic circuitry driven by network software to provide an electronic identification for each item of office equipment, and to encode and route the messages to the proper equipment.

A known form of network apparatus comprises, a network hub with multiple communication ports grouped with the hub. The office equipment, located at various work sites near the hub, are linked to the hub by electrical cables that plug into the communication ports. The hub embodies network circuitry that electronically links each of the communication ports to the network. The network can be expanded in size to reach office equipment at distant work sites, for example, by using additional hubs that are linked, one to another, by what is known as backbone wiring. Each of the additional hubs provides additional communications ports that connect more office equipment into the network. A network with more than one hub is needed to serve a large office, where the work sites are distributed over large areas of a building or on different floors of a building. However, many smaller offices of different sizes exist in the marketplace, which can be served by only one hub. Even among these smaller offices the number of communication ports varies extensively. Providing a hub with different numbers of communication ports to serve the needs of different offices requires a complex inventory of different parts, and a large number of hubs of different construction. A problem to be solved is to provide a network hub that is easily adaptable with a small number of communication ports or with a larger number of communication ports.

A small office can not afford an expensive a hub constructed with more communication ports than are needed. The marketplace has a need for a network hub of least expense, which has a limited number of communications ports to link together a limited number of work sites in an office of small size. The marketplace further has a need for a hub that is capable of an upgrade to add additional communications ports, thereby to serve an office that grows in size, needing more communications ports. A hub that is capable of an upgrade to add additional communications ports advantageously adapts the hub to serve different offices of varied sizes. By providing the hub with the capability for an upgrade, a network of original small size and least expense becomes expandable with a capacity for additional communications ports, without the need for additional hubs.

SUMMARY OF THE INVENTION

According to the invention, an expansion module with additional communications ports is provided to upgrade a hub that has a limited number of communication ports. The expansion module is adapted for connection with the base hub for a communications network. According to an embodiment, the expansion module comprises, additional communications ports, a mating expansion port opening in the expansion module for facing an expansion port opening in the hub when the expansion module is against the hub, and a mating interconnection board that aligns and mates with a card edge connector on the base hub when the expansion module is against the hub.

According to an embodiment, the expansion module comprises, an interconnection board facing an expansion port opening for facing a mating expansion port opening in a duplicate expansion module when the expansion module is against the duplicate expansion module, and an interconnection board with a card edge connector facing the expansion port opening, the card edge connector being adapted for connection with a mating interconnection board on the duplicate expansion module.

According to an embodiment, the communication ports and the mating interconnection board mount to a motherboard in the sxpansion module. According to a further embodiment, the motherboard is a duplicate of a motherboard in the hub.

DETAILED DESCRIPTION

Figure 1:
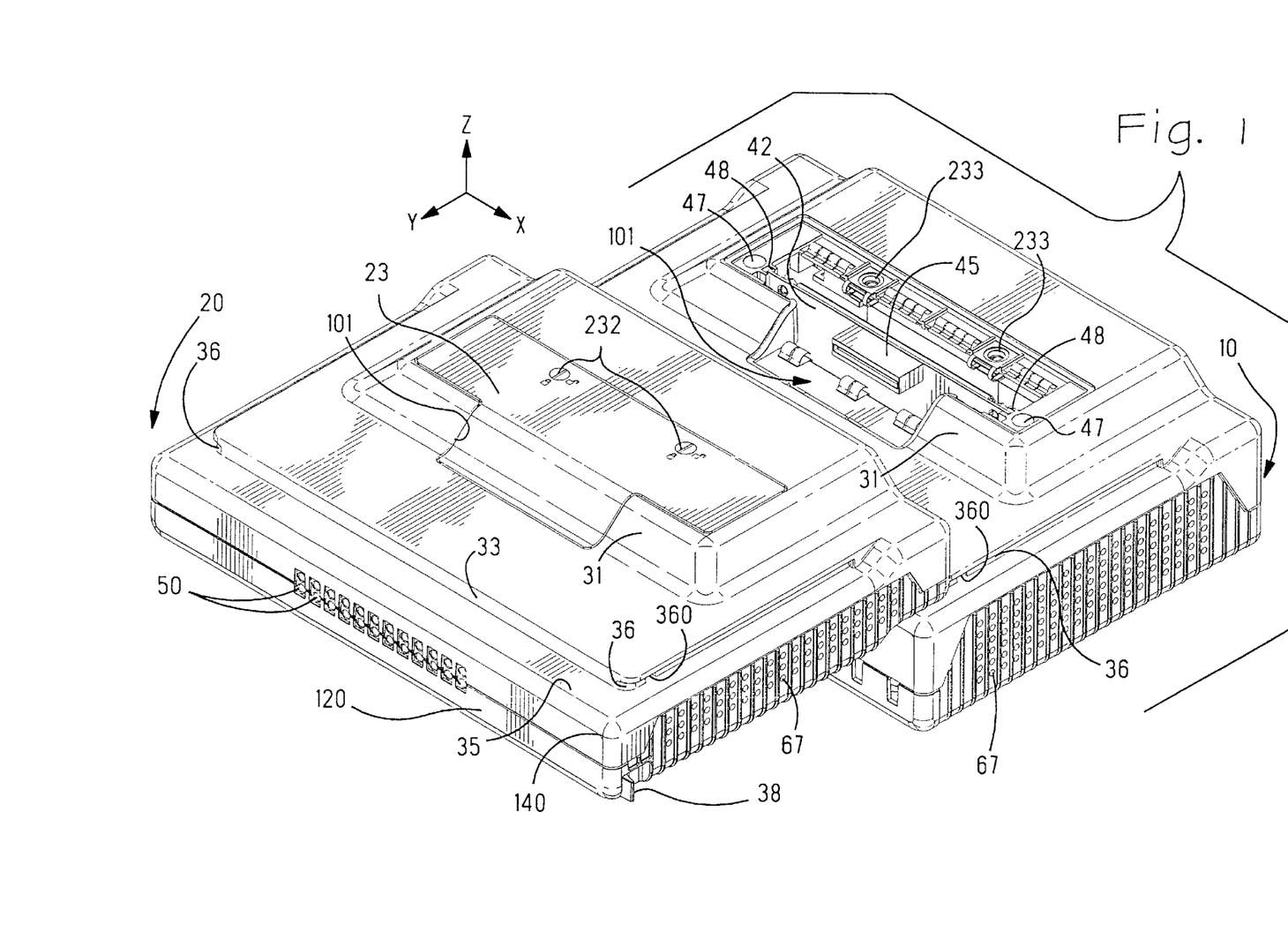
FIG. 1 is an isometric view of a network hub for use in a communications network and an expansion module, illustrated with parts separated from one another.

With reference to FIG. 1 a network apparatus comprises, an enclosure in the form of a base hub 10 and an enclosure in the form of an expansion module 20.

Figure 3:
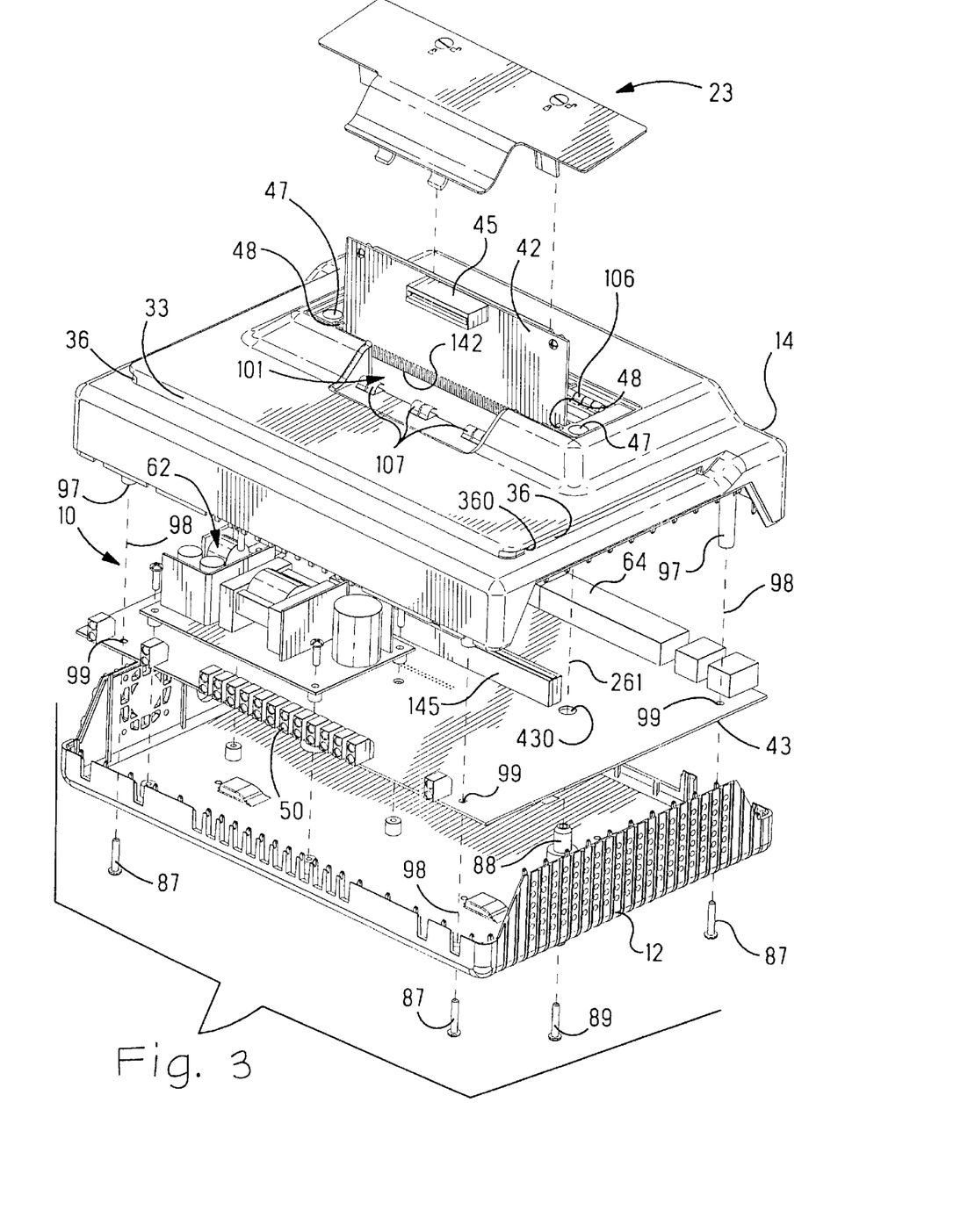
FIG. 3 is an isometric view of the hub as shown in FIG. 1, with parts separated from one another.
Figure 5:
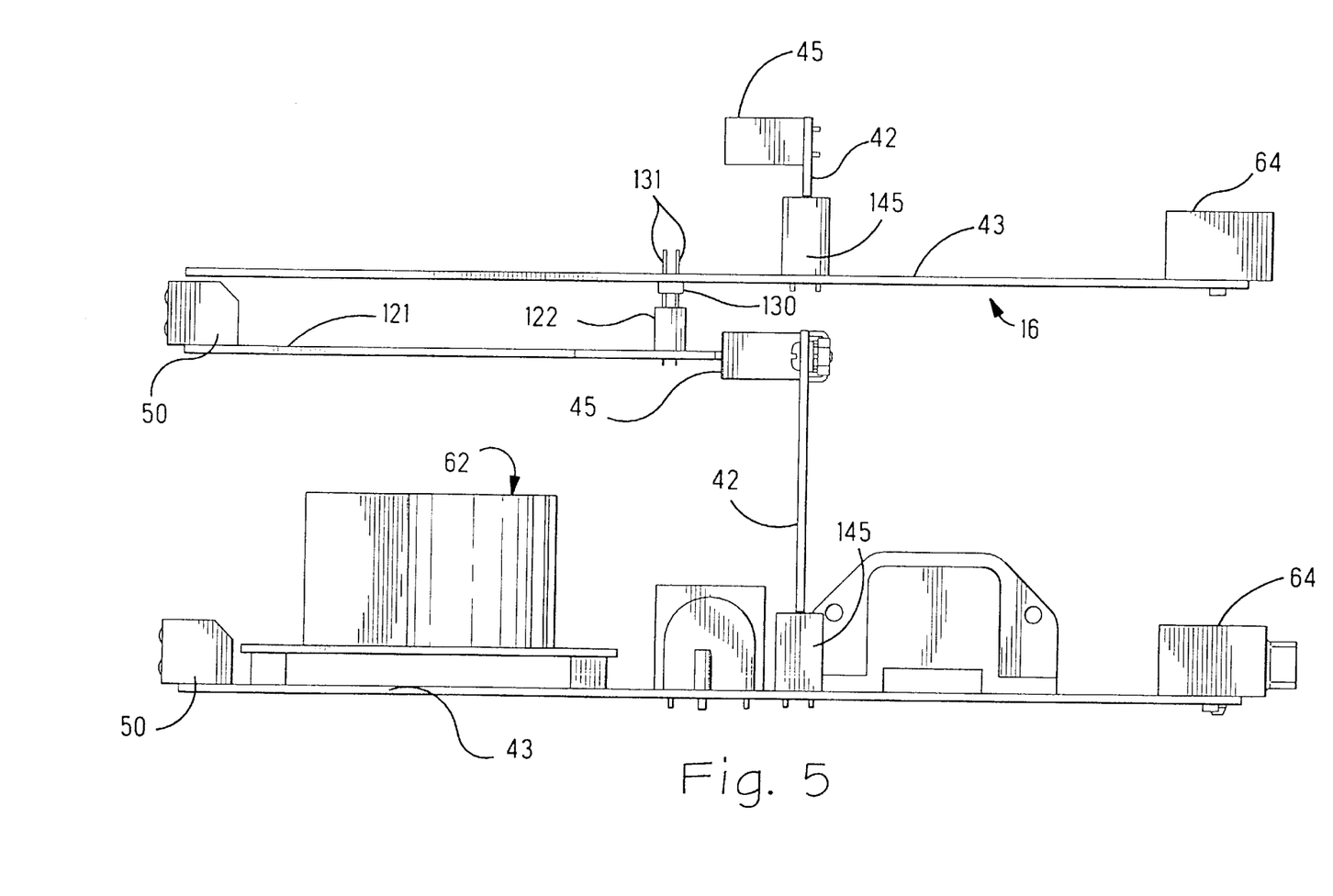
FIG. 5 is a side view of an interconnection mechanism comprising, the portion as shown in FIG. 3 and another portion that is inside the hub shown in FIG. 1.
Figure 7:
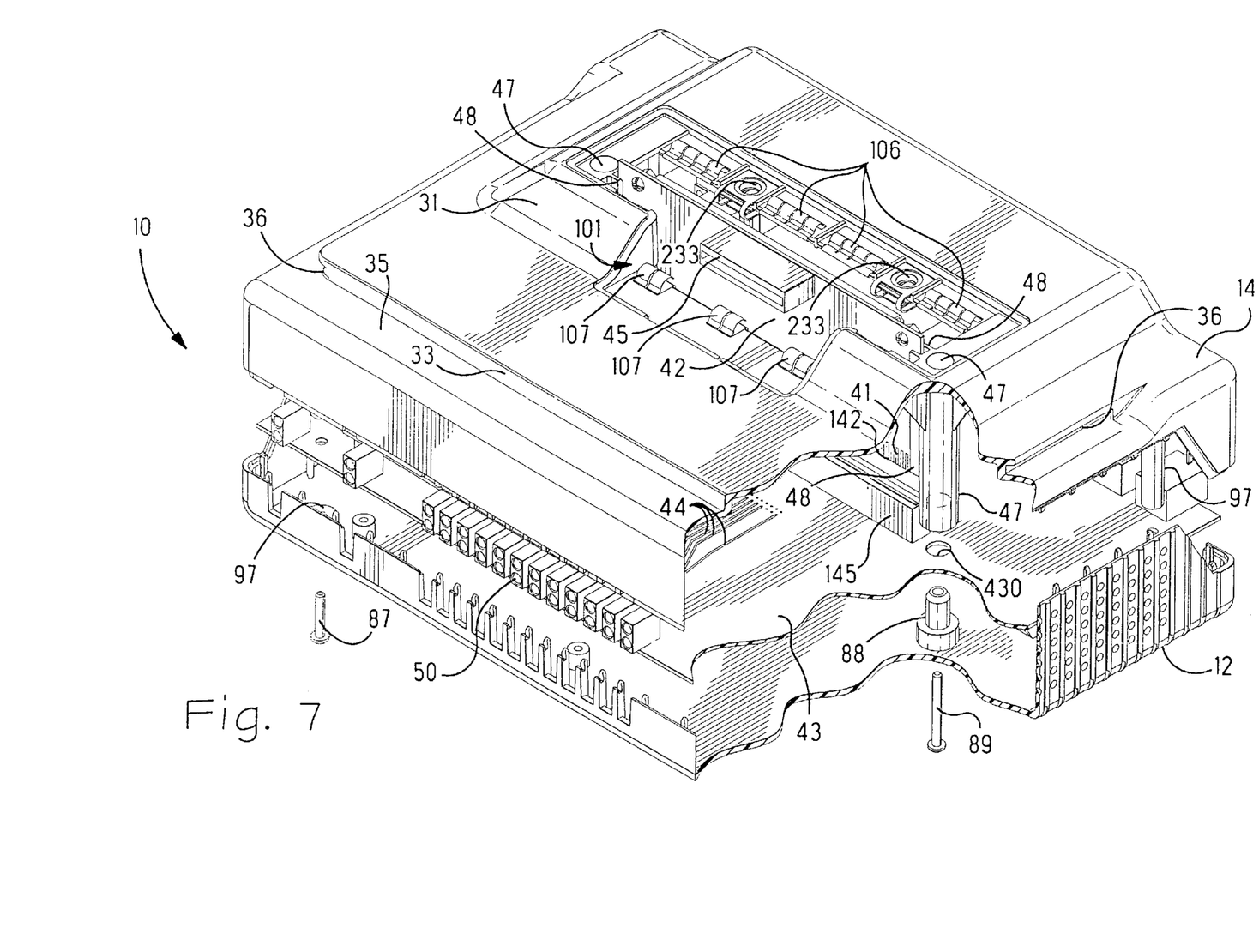
FIG. 7 is a view similar to FIG. 3, with parts cut.

As shown in FIG. 7, the base hub 10 encloses a motherboard 43 fabricated as a circuit board, with conventional conducting paths on the circuit board forming electrical circuitry 44 on the motherboard 43. With reference to FIGS. 3 and 5, mounted on the motherboard 43 in the base hub 10 are electronic circuit components and the power supply comprising active circuitry 62, shown diagrammatically, including a power source, for operation in a communications network. For example, the network may require the active circuitry 62 to be compatible with an Ethernet system or, instead, with a Token Ring system. For either of the systems, the circuit components comprising the active circuitry 62 are conventional and known in the industry.

Figure 6:
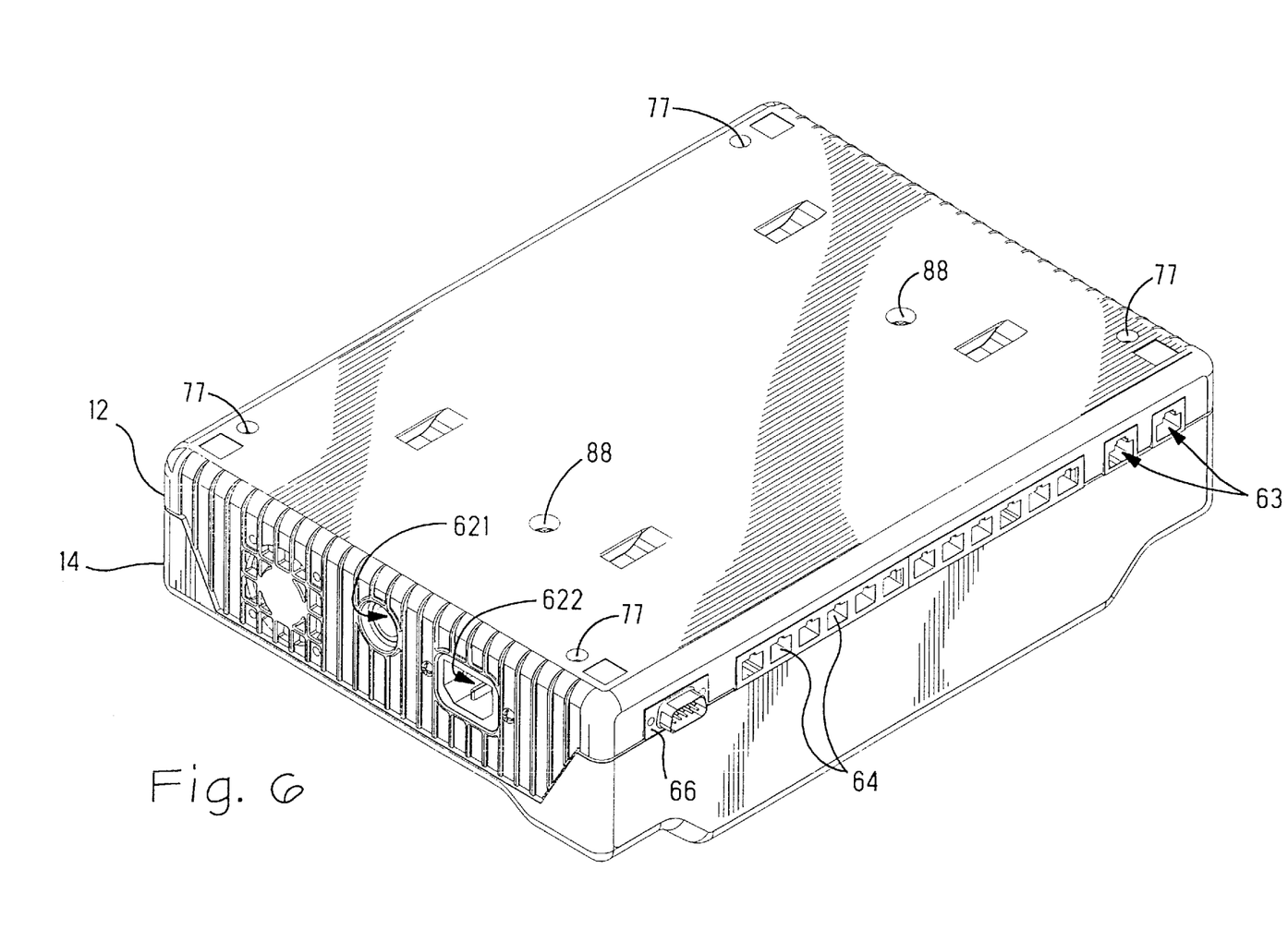
FIG. 6 is an isometric view of a bottom side of the hub that is shown in FIG. 1.

Also mounted on the motherboard 43 in the base hub 10 are multiple electrical connectors known in the industry and comprising, multiple communication ports 64, FIGS. 3 and 6, facing an exterior of the base hub 10 for connection to cables extending from various office equipment located at various work sites. The known use of the communication ports 64 in a communications network will now be described. For example, various office equipment, located at various work sites near the base hub 10, have electrical cables that plug into respective communication ports 64 to link the office equipment to the base hub 10. The base hub 10 embodies the known active circuitry 62 that electronically links each of the communication ports 64 to the network. The circuitry 44 on the motherboard 43 in the base hub 10 connects the active circuitry 62 with the communication ports 64. The active circuitry 62 on the motherboard 43 in the base hub 10 links together the network circuitry and the multiple communication ports 64 to comprise a communications network for the various office equipment that have electrical cables that plug into respective communication ports 64. The various office equipment become linked to the network to communicate with one another over the network.

Figure 4:
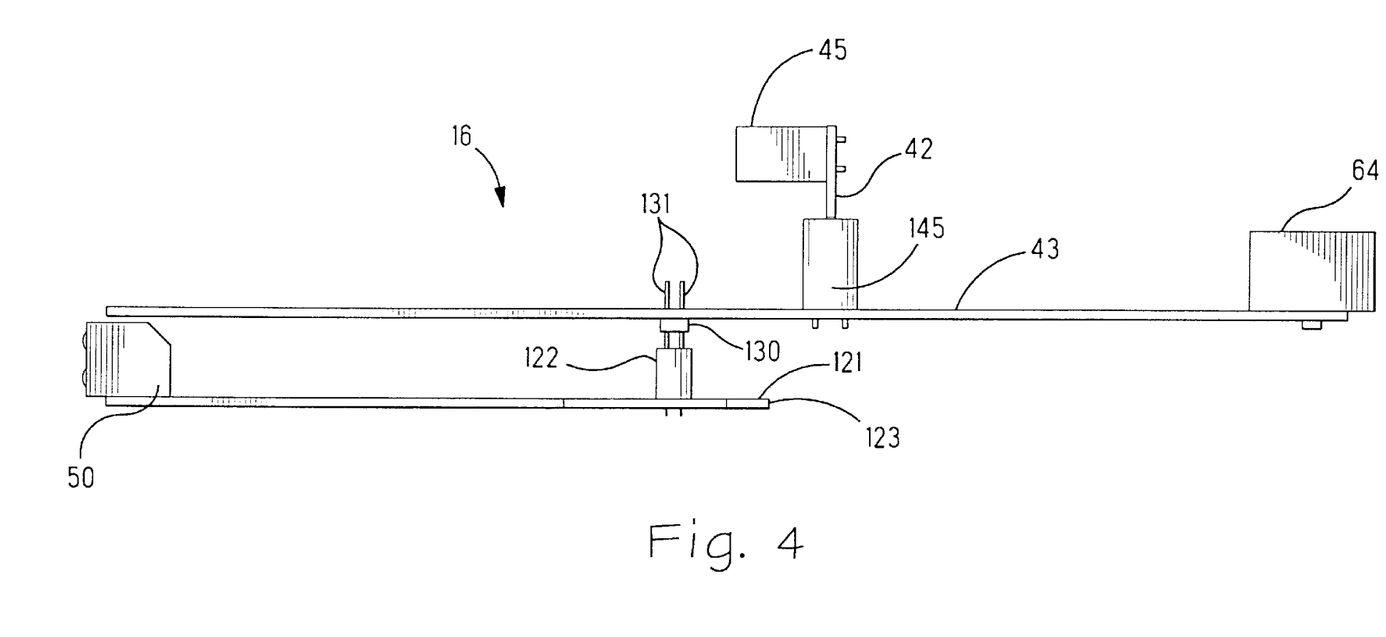
FIG. 4 is a side view of a portion of an interconnection mechanism, which portion is in the expansion module that is shown in FIG. 2.

The base hub 10 provides a communications network of least expense and a limited number of communication ports 64 to link together a limited number of work sites in an office of small size. The hub 10 is capable of an upgrade, thereby to serve an office that grows in size, needing additional communication ports 64. An interconnection mechanism 16, as shown in FIGS. 4 and 5, is provided for adding the additional communication ports 64. For example, a portion of the interconnection mechanism 16 is in the base hub 10.

As shown in FIG. 1, the base hub 10 is provided with an expansion port opening 101. Exposed at the opening is a portion of the interconnection mechanism 16 comprising, a circuit board in the form of an interconnect board 42 and an electrical connector 45 on the interconnect board 42. With reference to FIG. 3, the interconnect board 42 is fabricated as a circuit board, with conventional conducting paths on the circuit board forming electrical circuitry 41. For example, the connector 45 comprises a conventional card edge connector having electrical contacts that connect with the circuitry 41, FIG. 7, on the interconnect board 42. The circuitry 41 extends to an edge 142 on the interconnect board 42. The circuitry 41 at the edge 142 removably plugs into an electrical connector 145 mounted on the motherboard 43 in the base hub 10.

For example, the connector 145 comprises a conventional card edge connector having electrical contacts that frictionally engage the circuitry 41 at the edge 142 on the interconnect board 42. The electrical contacts connect with the electrical circuitry 44, FIG. 7, on the motherboard 43. Thus, the interconnect board 42 and the electrical connector 145 are constructed for disconnect mating to interconnect electrically the circuitry 41 on the interconnect board 42 and the circuitry 44 on the motherboard 43 in the base hub 10.

Figure 2:
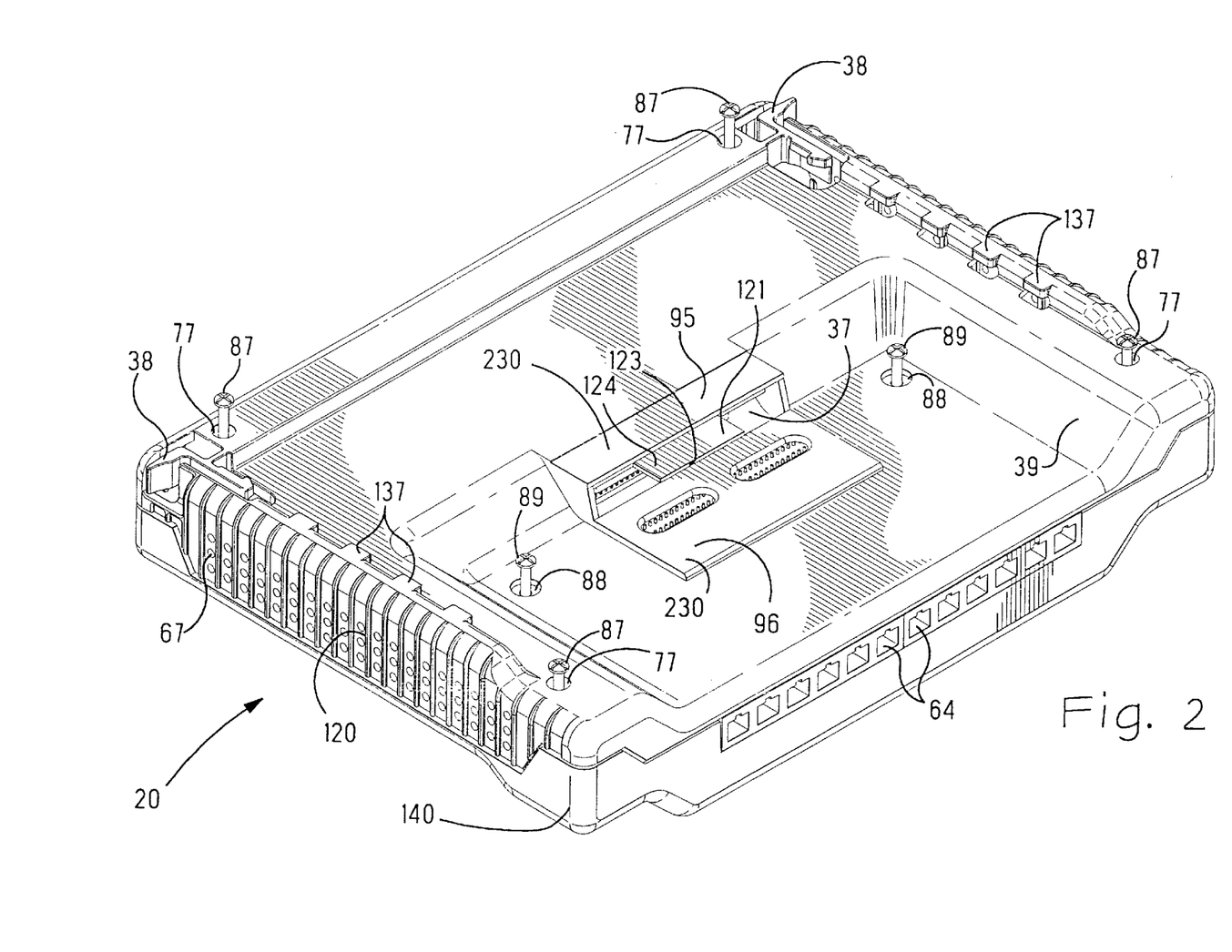
FIG. 2 is an isometric view of a bottom side of the expansion module that is shown in FIG. 1.
Figure 9:
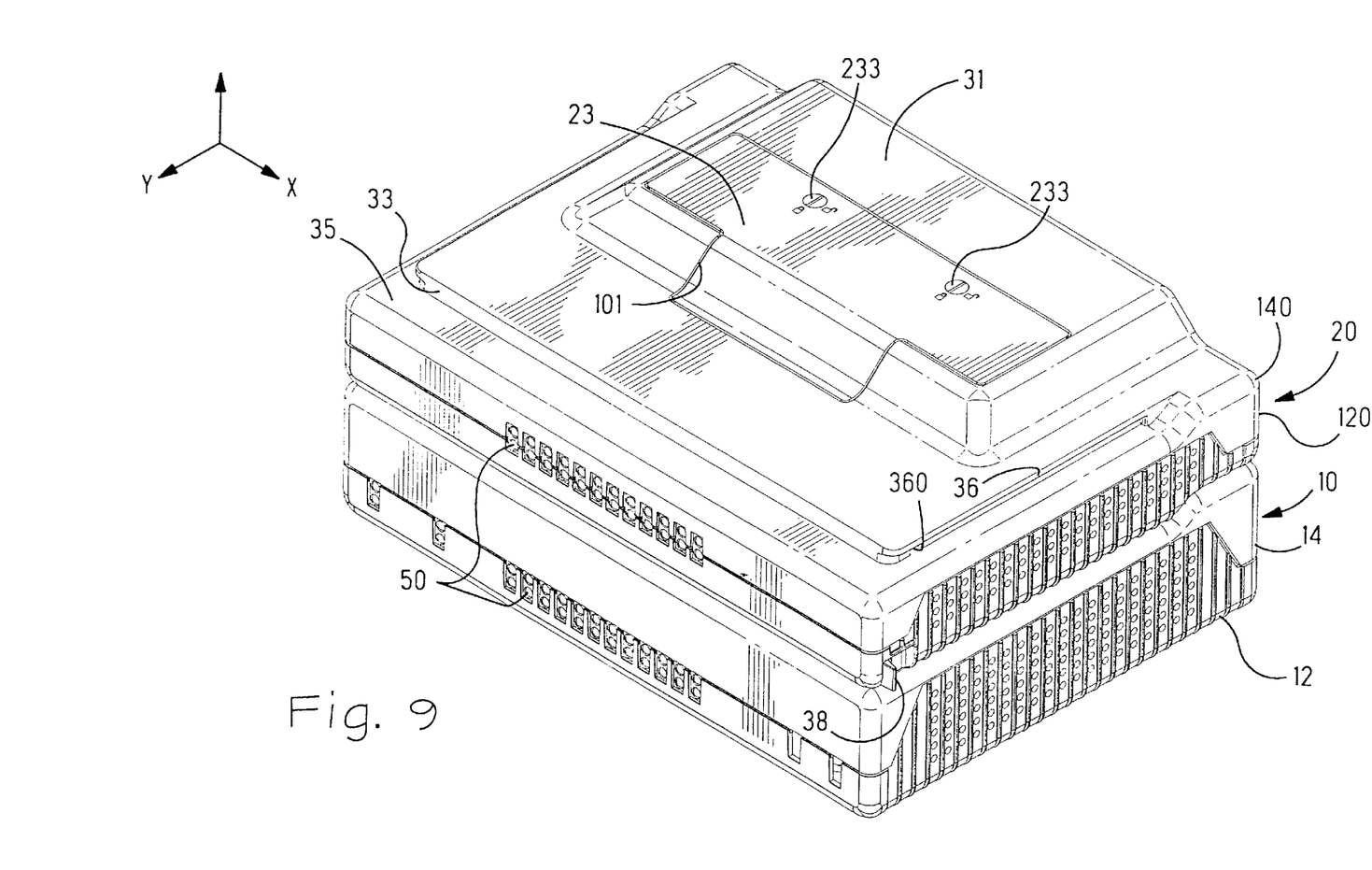
FIG. 9 is a view similar to FIG. 1, with the expansion module stacked against the base hub and interlocked to resist movement parallel to three orthogonal axes.

For example, a portion of the interconnection mechanism 16 is in an expansion module 20. With reference to FIG. 2, a bottom side of the expansion module 20 is provided with a hub connection cavity 37 at which projects another portion of the interconnection mechanism 16 comprising, a mating interconnect board 121. The mating interconnect board 121 is exposed at the cavity 37 for disconnect mating with the connector 45 and the interconnect board 42. The interconnect board 42 and the connector 45 are exposed at the opening 101 for disconnect mating with the mating interconnect board 121. When the expansion module 20 is stacked against the base hub 10, FIG. 9, the bottom side of the expansion module 20 covers the expansion port opening 101. An edge 123 on the mating interconnect board 121 removably inserts into the connector 45.

The mating interconnect board 121 is fabricated as a circuit board with conventional conducting paths that form electrical circuitry 124, FIG. 2, on the mating interconnect board 121. The circuitry 124 extends to the edge 123 on the mating interconnect board 121. The circuitry 124 at the edge 123 of the mating interconnect board 121 becomes inserted into the connector 45. Thus, the mating interconnect board 121 mates with the electrical connector 45 to interconnect electrically the circuitry 124 on the mating interconnect board 121 and the circuitry 41 on the interconnect board 42.

With reference to FIG. 4, the interconnection mechanism 16 further comprises, a circuit board in the form of a second motherboard 43, and additional communication ports 64 mounted on the second motherboard 43. The additional communication ports 64 are duplicates of the communication ports 64 described in conjunction with the motherboard 43 in the base hub 10. The additional communication ports 64 are mounted in the same positions with respect to the duplicate motherboard 43 that the corresponding communication ports 64 are mounted with respect to the motherboard 43 in the base hub 10. The respective motherboards 43 receive the corresponding communication ports 64 in the same places on the respective motherboards. The additional communication ports face an exterior of the expansion module 20 for connection to cables extending from various office equipment at various work sites.

An electrical connector, for example, a conventional post header 130, is mounted on the underside of the second motherboard 43. The conventional post header 130 mates with an electrical connector in the form of a post receiving receptacle 122 mounted on the mating interconnect board 121.

For example, the post header 130 has conducting posts 131 that project through the second motherboard 43. For example, the post receiving receptacle 122 contains electrical contacts that frictionally engage the conducting posts 131 that project from the post header 130. The electrical contacts on the post receiving receptacle 122 engage the electrical circuitry 124 on the mating interconnect board 121.

The second motherboard 43 is fabricated as a circuit board, with conventional conducting paths on the circuit board forming additions to the electrical circuitry 44 on the motherboard 43. The additions to the electrical circuitry 44 on the second motherboard 43 link the additional communication ports 64 with respective posts 131 on the conventional post header 130. The circuitry 44 on both the motherboards 43 are duplicates of one another. Some of the circuitry 44 is unused, depending upon which of the motherboards 43 is being constructed. For example, the circuitry 44 for interconnecting the active circuitry 62 including the power supply and other components of the network electronics on the motherboard 43 in the base hub 10 is present and unused on the motherboard 43 in the expansion module 20 that is constructed without the selected components of active circuitry 62. Further, for example, the portions of the circuitry 44 for interconnecting the post header 130 with the additional communication ports 64 is present and unused on the motherboard 43 in the base hub 10 on which the active circuitry 62 is present. Additional components of the network electronics may be on the motherboard 43 in the expansion module that are not present on the motherboard 43 in the base hub 10. Such additional components can be interconnected by circuitry on the motherboard 43 that is unused on the motherboard 43 in the base hub 10.

With reference to FIGS. 4 and 5, disconnect mating of the second motherboard 43 with the motherboard 43 will now be described. The motherboard 43 having the active circuitry 62 is provided with the connector 145 and the interconnect board 42 and the connector 45. The second motherboard 43 without the active circuitry 62 is provided with the post header 130 and the receptacle 122 and the mating interconnect board 121. When the mating interconnect board 121 is disconnectably mated with the connector 45, the additional communication ports 64 on the second motherboard is added to a communications network being served by the active circuitry 62.

A lid 23, FIG. 3, is constructed to removably cover the expansion port opening 101 in the base hub 10. The lid 23 is removable from the opening 101 to permit interconnection of the portion of the interconnection mechanism shown in FIG. 4, with the remainder of the interconnection mechanism, as shown in FIG. 5. The lid 23 is replaceable over a duplicate opening 101 in the expansion module 20, FIG. 1. The duplicate opening 101 in the expansion module 20, when uncovered by removal of the lid 23, permits the addition of additional communication ports 64 by stacking another duplicate expansion module 20. For example, with reference to FIG. 4, a duplicate connector 145 is mounted on the second motherboard 43. Another interconnect board 42 having a corresponding connector 45 thereon, is removably connected with the connector 145 on the second motherboard 43. The duplicate connector 45 and the accompanying interconnect board 42 are exposed at the duplicate opening 101 for connection with a duplicate expansion module 20.

Thus, the interconnection mechanism 16 is adaptable with an additional interconnect board 42 and an additional connector 45, which adapts the expansion module 20 for adding another expansion module 20, for example, by stacking a duplicate expansion module 20 against the expansion module 20 that is shown in FIGS. 1 and 2.

Each interconnect board 42 at least in the base hub 10 is removable from a corresponding connector 145 to be replaced by an upgrade interconnect board 42 having thereon upgrade circuitry, for example upgrade network management circuitry. The circuitry is known in the industry but has been relocated to appear on the interconnect boards 42. The network management circuitry comprises circuit components having the electrical values identified in tables that are appended herein. According to the tables, a number of different upgrade interconnect boards 42 can vary in construction according to the selection of components organized according to the tables.

As shown in FIG. 3, the enclosure of the base hub 10 is bipartite, and comprises, a hollow base 12 and a hollow cover 14 that are assembled together to enclose the interconnection mechanism. For example, the base 12 and cover 14 are molded of plastics material that is conductive on the inside surfaces for electrical grounding and RF and EMI shielding. The plastics material itself may be conductive, or rendered conductive by being plated with a conducting coating of metal on interior surfaces. Similarly, the enclosure of the expansion module 20 is bipartite, and comprises, a molded, hollow base 120 and a molded, hollow cover 140 that are conductive on interior surfaces, and that are assembled together to enclose the portion of the interconnection mechanism as shown in FIGS. 2 and 4. Air vents 67 are provided by small apertures through the base hub 10 and the expansion module 20.

Figure 8:
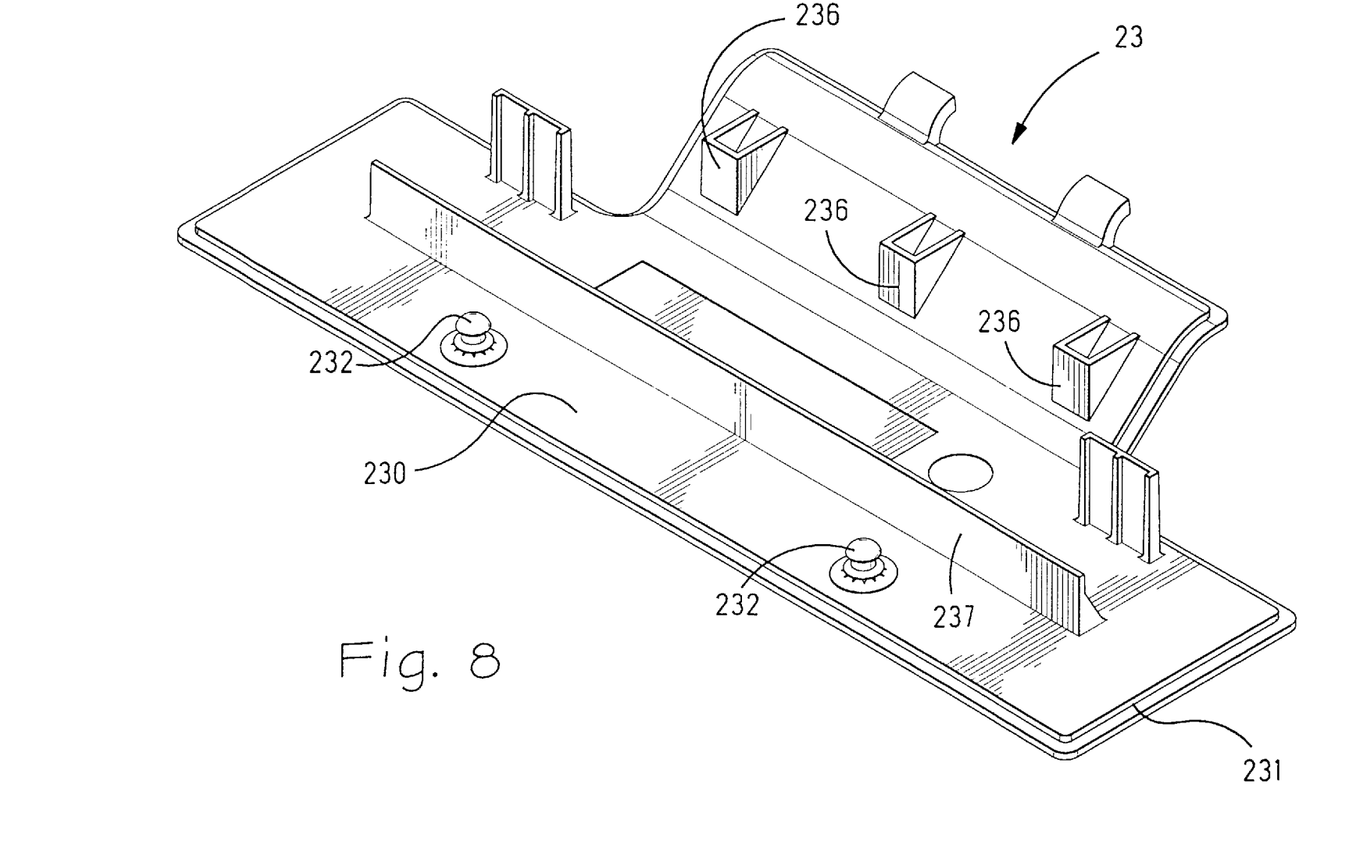
FIG. 8 is an isometric view of an underside of a lid.

Additional RF and EMI shielding is provided at each corresponding opening 101, in the corresponding base hub 10 and in the expansion module 20, by conducting resilient spring clips 106 and 107 distributed around a periphery of the respective openings 101. The clips 106 and 107 are fabricated of BeCu, for example, and engage the conductive coatings on the corresponding interiors of the respective base hub 10 and the expansion module 20. With reference to FIG. 8, the lid 23 is provided on its underside with projecting flanges 236 that compressively engage corresponding clips 107 when the lid 23 covers a corresponding opening 101. The lid is provided further on its underside with projecting flanges 237 that compressively engage corresponding clips 106 when the lid 23 covers a corresponding opening 101. A stepped outer edge 231 on the underside of the lid 23 registers in the edge of the corresponding opening 101. Fasteners 232 are captive on the lid 23 and removably secure in corresponding sockets 233 adjacent to the corresponding opening 101. The lid 23 is molded, for example, of unitary plastics material coated on its underside with a conducting coating 230 of metal. The flanges 236 and 237, being coated with the coating 230, establish electrical contact with the clips 106 and 107 to extend electrical shielding continuously through the clips 106 and 107 and the lid 23 that covers the corresponding opening 101. With reference to FIG. 2, the cavity 37 is encircled by a rectangular shroud 95, that projects to receive the connector 45 on a corresponding interconnect board 42, when the mating interconnect board 122 mates with the corresponding connector 45. A raised bridging plate 96 projects forwardly of the shroud 95. Additional conductive plating 230 is on the shroud 95 and the bridging plate 96. When the expansion module 20 covers a corresponding opening 101, the shroud 95 will compressively engage the clips 107, and the bridging plate 96 will bridge across the corresponding opening 101 and compressively engage some of the clips 106. Thereby, RF and EMI shielding bridges across the corresponding opening 101 when the corresponding opening 101 is covered by an expansion module 20.

As shown in FIGS. 2 and 3, fasteners 87 project through openings 77 through the bases 12 and 120 of the respective base hub 10 and expansion module 20. The fasteners 87 project through openings 99 in respective motherboards 43. The openings 99 are aligned along respective axes 98. Unitary, columnar support members 97 are aligned along the axes 98 and depend from the covers 14 and 140, respectively, of the base hub 10 and the expansion module 20. The support members 97 are hollow to receive respective fasteners 87 that are anchored in the support members 97 to retain together the bipartite parts, respectively, of the base hub 10 and the expansion module 20. The support members 97 are coated with a conductive material to provide ground connections for engagement with ground portions of the circuitry 44 on the corresponding motherboard 43 near the openings 99 through the motherboard 43. Similarly, as shown in FIGS. 2 and 3, unitary and hollow projecting alignment posts 88 project inside the respective bases 12 and 120 on the base hub 10 and the expansion module 20. The alignment posts 88 are in alignment with unitary and hollow columns 47 that project inside beside opposite ends of each of the openings 101 in the covers 14 and 140 of the respective base hub 10 and expansion module 20. The hollow alignment columns 47 provide open sockets that fit over the posts 88. The hollow alignment posts 88 receive fasteners 89 that pass through the alignment posts 88 and become anchored in the columns 47. The alignment posts 88 and the columns 47 are coated with conductive material to provide ground connections for engagement with ground sections of the circuitry 44 on the motherboard 43 adjacent to alignment apertures 430 through the motherboard 43.

With reference to FIGS. 3 and 7, the alignment posts 88 are in alignment with respective alignment apertures 430 through respective motherboards 43. The apertures 430 are located adjacent opposite ends of respective connectors 145 on the motherboards 43. The motherboards 43 are assembled to respective base hub 10 and expansion module 20 by registration of the apertures 430 over the alignment posts 88. With respect to the expansion module 20, registration of the aperatures 430, through the corresponding motherboard 43, with the alignment columns 47 in the expansion module 20, will prealign the posts 131 with the post receiving receptacle 122 for blind mating of the posts with the receptacle 122. The mating interconnect board 121 already will have been attached by fasteners to the base 12 of the expansion module 20. The fasteners 89 project through the apertures 430 to anchor in the alignment columns 47. The fasteners 89 and 87 are self threading screws, for example. As shown in FIG. 3, respective apertures 430, respective alignment posts 88 and respective fasteners 89 extend along respective axes 261.

With reference to FIGS. 3 and 7, unitary with respective columns 47, channel shaped card guides 48 are beside respective openings 101 in the base hub 10 and the expansion module 20. The card guides 48 extend lengthwise along the respective columns 47, from the respective openings, and toward the respective connectors 145 on respective motherboards 43. The respective connectors 145 face toward respective openings 101. The card guides 48 extend from the openings 101 to the connector 145.

With reference to FIGS. 1, 3 and 7, blind mate connection of respective interconnect boards 42 will now be described. Respective interconnect boards 42 are inserted into respective openings 101, by inserting opposite edges of the interconnect boards 42 into and along open ends of the card guides 48, FIG. 3. The card guides 48 are aligned with respective connectors 145 on the motherboards 43. The card guides 48 align and guide the respective interconnect boards 42 without the connectors 145 being visible, thereby providing prealignment of the interconnect boards 42 for blind mating with the connectors 145. FIGS. 3 and 7 show the interconnect board 42 being prealigned by the card guides 48, and partially inserted along the channel shaped card guides 48. FIG. 1 shows the interconnect board 42 fully inserted into the base hub 10 and mating with the corresponding connector 145, as shown further in FIG. 5.

Additional features of the base hub 10 and the expansion module 20 will now be described. With reference to FIGS. 4 and 5, multiple visual status indicators 50 in the form of LEDs, for example, are mounted on the motherboard 43 and circuitry 44 in the base hub 10, and on the mating interconnect board 121 and the circuitry 124, for indicating the operating status of the communication ports 64 and other hub functions. As known in the industry, the LEDs illuminate to indicate, for example, whether the communication ports 64 are receiving or transmitting. The LEDs are visible at the exteriors of the base hub 10 and the expansion module 20, respectively.

As shown in FIG. 6, the base hub 10 comprises, external connections to a power source, for example, an AC, three prong, input port 622 and a DC input port 621, both facing an exterior of the base hub 10 for supplying electrical power to the motherboard 43 in the base hub 10. The base hub 10 further comprises, a serial port 66 and a network backbone connection port 63, both facing an exterior of the base hub, for example, a ring in/out connection, or, alternatively, not shown, an AUI port, optionally for linking the base hub 10 to a larger area network. The circuitry 44 on the motherboard 43 connects the ports 621, 622, 66 and 63 to the active circuitry 62 that also includes a fan in a known manner.

With reference to FIGS. 1, 2 and 3, each of the base hub 10 and the expansion module 20 is constructed for prealignment and blind mating of a corresponding connector 45 with a mating interconnect board 121. The corresponding opening 101 on either the base hub 10 or the expansion module 20 extends through a raised mesa 31 with sloped sides. The corresponding connector 45 and the corresponding mating interconnect board 121 mate along an axis of mating that extends through the opening 101 and through one of the sides of the mesa 31. A raised step 33 circumscribes three sides of the mesa 31. The step 33 is behind a front surface 35. Channel shaped tracks 36 extend parallel to the axis of mating and along two sides of the raised step 33. The channel shaped tracks 36 have open front ends. The mesa 31 is between the tracks 36.

With reference to FIG. 2, unitary fingers 137 project along the underside of the expansion module 20. The fingers 137 are in an arrangement of two series that extend toward one another to define tracks on the expansion module. A mesa receiving cavity 39 is recessed in the underside between the two series of fingers 137. The mesa receiving cavity 39 has sloping sides and an open side facing toward a rear of the expansion module 20. Each of the tracks defined by the series of fingers 137 extends parallel to the axis of mating for when the mating interconnect board 121 mates with the corresponding connector 45. The corresponding connector 45 can be at an opening 101 in either the base hub 10 or another expansion module 20. Both series of fingers 137 are stepped back from a rear of the expansion module 20, to rest the expansion module upon the base hub prior to prealignment.

Prealignment and blind mating is accomplished according the following procedure. The underside of the expansion module 20, as shown in FIG. 1, rests against a corresponding front surface 35 on the base hub 10, or, alternatively, a corresponding front surface 35 on another expansion module 20. The expansion module is moved parallel to an Y-axis, causing the tracks defined by the series of fingers 137 to enter and slide along respective tracks 36. With the tracks defined by the series of fingers 137 in respective tracks 36, the expansion module 20 is restrained from movement parallel to the X-axis and parallel to the orthogonal Z-axis. The expansion module 20 in the tracks 36 prealigns the mating interconnect board 121 and the corresponding connector 45 along the axis of mating. When the expansion module 20 is moved to cover the opening 101, the mating interconnect board 121 and the corresponding connector 45 are prealigned and blind mated, meaning, that they are aligned along their axis of mating and are mated together without being in view.

With reference to FIG. 2, hook shaped latches 38 are resiliently pivotable on strap like hinges unitary with the expansion module 20. A tip on each of the latches 38 is aligned with a corresponding series of fingers 137. With reference to FIG. 1, the tips of the latches 38 will enter corresponding latch receiving cavities 360 in respective tracks 36 to lock the latches 38 in the tracks 36. The expansion module 20 then becomes interlocked from movement parallel to the three orthogonal axes, the X-Axis, the Y-Axis and the Z-axis. The latches 38 have handles that are manually deflected by pulling on them to pivot the latches 38 and unhook them from the cavities 360. Continued pulling on the handles of the latches 38 occurs in the same direction as pulling on the expansion module 20 to cause removal of the expansion module slidably along the tracks 36.

An advantage of the invention resides in an interconnection mechanism for adding additional communication ports to a network hub, so that the hub can serve an increased number of communication ports.

Other embodiments and modifications of the embodiment described are intended to be covered by the spirit and scope of the appended claims.

| Item | Description | Part Number | Quantity -001 | Token Ring Standard Management Reference Designation |
|---|---|---|---|---|
| 1 | Printed Circuit Board, MPM | 1-026004-001 | 1 | |
| 2 | Support Bracket, Vert. Interconnect | 058001-001 | 1 | |
| 3 | Rivit | 0-055054-002 | 2 | |
| 4 | Socket, 32 pin PLCC | 63068-003 | 2 | |
| 5 | Connector, 72 pin SIMM | 7-382487-2 | 0 | |
| 6 | Shorting Strap | 63012-102 | 1 | |
| 7 | Capacitor, Tantalum, 4.7 uF, 3528 | 40062-010 | 1 | C1 |
| 8 | Capacitor, 47 pF, 0603 | 40061-048 | 1 | C2 |
| 9 | Capacitor, 0.1 uF, 25 V (0603) | 40061-042 | 54 | C3–C52,C60–C63 |
| 10 | Header, 2x1 | 63011-002 | 1 | J2 |
| 11 | Connector, 2x15 Edge | 0-063131-002 | 1 | J3 |
| 12 | Resistor, 33,0603 | 40122-330 | 1 | R1,R4 |
| 13 | Resistor, 10k,0603 | 40122-103 | 23 | R2–R3,R5–R22,R24–R25,R44 R26–R30 |
| 14 | Resistor, 1k,0603 | 40122-102 | 5 | R26–R30 |
| 15 | Resistor, 4.7k,0603 | 40122-472 | 5 | R31–R34,R46 |
| 16 | Resistor, 110,0603 | 40122-111 | 19 | R36–R43,R47,R49,R54–R62 |
| 17 | Resistor, 0,0603 | 40122-000 | 2 | R5,R45,R48 |
| 18 | Processor, 60960JA | 45149-002 | 1 | U1 |
| 19 | Processor, 80960JD | 45149-003 | 0 | |
| 20 | Programmed Logic | 1-048C02-005 | 1 | U2 |
| 21 | Programmed Logic | 1-048C02-006 | 1 | U3 |
| 22 | DRAM, 256kx16 | 45099-006 | 2 | U5,U20 |
| 23 | Programmed PROM (TRSA) | 1-048C02-008 | 1 | U6 |
| 24 | Programmed PROM (TRA) | 1-048C02-010 | 0 | |
| 25 | Programmed PROM (ENSA) | 1-048002-011 | 0 | |
| 26 | Programmed PROM (ENA) | 1-048002-013 | 0 | |
| 27 | Oscillator, 32 MHz | 45116-419 | 1 | U9 |
| 28 | Dual 4 to 1 Mux/Demux | 0-45208-001 | 0 | |
| 29 | Octal Bus Transceiver, soic wb | 45085-245 | 4 | U12–U15 |
| 30 | Programmed Logic | 1-048002-003 | 1 | U16 |
| 31 | Programmed Logic | 1-048002-004 | 1 | U17 |
| 32 | Token Ring MAC | 0-045211 | 1 | U18 |
| 33 | Token Ring Accelator | 0-045210 | 0 | |
| 34 | Programmed Logic | 1-048002-007 | 1 | U21 |
| 35 | Programmed PROM (TRSB) | 1-048002-009 | 1 | U22 |
| 36 | Programmed PROM (ENSB) | 1-048002-012 | 0 | |
| 37 | Quad 2 to 1 Mux,soic nb | 45085-157 | 1 | U23 |
| 38 | Ferrite Bead, SMT | 40110-001 | 2 | Z1–Z2 |
| 39 | Label, MAC Address | 1-053022-001 | 1 | |
| 40 | Label, MAC Address | 1-053022-002 | 0 | |
| 41 | Label, Serial Number | 51043-004 | 1 | |

| Item | Description | Part Number | Quantity -002 | Token Ring Standard Management Reference Designation |
|---|---|---|---|---|
| 1 | Printed Circuit Board, MPM | 1-026004-001 | 1 | |
| 2 | Support Bracket, Vert. Interconnect | 058001-001 | 1 | |
| 3 | Rivit | 0-055054-002 | 2 | |

-continued

| | | | | |
|---|---|---|---|---|
| 4 | Socket, 32 pin PLCC | 63068-003 | 2 | |
| 5 | Connector, 72 pin SIMM | 7-382487-2 | 1 | |
| 6 | Shorting Strap | 63012-102 | 1 | |
| 7 | Capacitor, Tantalum, 4.7 uF, 3528 | 40062-010 | 1 | C1 |
| 8 | Capacitor, 47 pF, 0603 | 40061-048 | 1 | C2 |
| 9 | Capacitor, 0.1 uF, 25 V (0603) | 40061-042 | 54 | C3–C52,C60–C63 |
| 10 | Header, 2x1 | 63011-002 | 1 | J2 |
| 11 | Connector, 2x15 Edge | 0-063131-002 | 1 | J3 |
| 12 | Resistor, 33,0603 | 40122-330 | 2 | R1,R4 |
| 13 | Resistor, 10k,0603 | 40122-103 | 23 | R2–R3,R5–R22,R24–R25,R44 |
| 14 | Resistor, 1k,0603 | 40122-102 | 5 | R26–R30 |
| 15 | Resistor, 4.7k,0603 | 40122-472 | 5 | R31–R34,R46 |
| 16 | Resistor, 110,0603 | 40122-111 | 19 | R36–R43,R47,R49,R54–R62 |
| 17 | Resistor, 0,0603 | 40122-000 | 1 | R45,R48 |
| 18 | Processor, 60960JA | 45149-002 | 0 | |
| 19 | Processor, 80960JD | 45149-003 | 1 | U1 |
| 20 | Programmed Logic | 1-048C02-005 | 1 | U2 |
| 21 | Programmed Logic | 1-048C02-006 | 1 | U3 |
| 22 | DRAM, 256kx16 | 45099-006 | 3 | U4–U5,U20 |
| 23 | Programmed PROM (TRSA) | 1-048C02-008 | 0 | |
| 24 | Programmed PROM (TRA) | 1-048C02-010 | 1 | U6 |
| 25 | Programmed PROM (ENSA) | 1-048002-011 | 0 | |
| 26 | Programmed PROM (ENA) | 1-048002-013 | 0 | |
| 27 | Oscillator, 32 MHz | 45116-419 | 1 | U9 |
| 28 | Dual 4 to 1 Mux/Demux | 0-45208-001 | 0 | |
| 29 | Octal Bus Transceiver, soic wb | 45085-245 | 4 | U12–U15 |
| 30 | Programmed Logic | 1-048002-003 | 1 | U16 |
| 31 | Programmed Logic | 1-048002-004 | 1 | U17 |
| 32 | Token Ring MAC | 0-045211 | 1 | U18 |
| 33 | Token Ring Accelator | 0-045210 | 1 | U19 |
| 34 | Programmed Logic | 1-048002-007 | 1 | U21 |
| 35 | Programmed PROM (TRSB) | 1-048002-009 | 0 | |
| 36 | Programmed PROM (ENSB) | 1-048002-012 | 0 | |
| 37 | Quad 2 to 1 Mux,soic nb | 45085-157 | 1 | U23 |
| 38 | Ferrite Bead, SMT | 40110-001 | 2 | Z1–Z2 |
| 39 | Label, MAC Address | 1-053022-001 | 1 | |
| 40 | Label, MAC Address | 1-053022-002 | 0 | |
| 41 | Label, Serial Number | 51043-004 | 1 | |

| Item | Description | Part Number | Quantity -003 | Ethernet Standard Management Reference Designation |
|---|---|---|---|---|
| 1 | Printed Circuit Board, MPM | 1-026004-001 | 1 | |
| 2 | Support Bracket, Vert. Interconnect | 058001-001 | 1 | |
| 3 | Rivit | 0-055054-002 | 2 | |
| 4 | Socket, 32 pin PLCC | 63068-003 | 2 | |
| 5 | Connector, 72 pin SIMM | 7-382487-2 | 0 | |
| 6 | Shorting Strap | 63012-102 | 1 | |
| 7 | Capacitor, Tantalum, 4.7 uF, 3528 | 40062-010 | 1 | C1 |
| 8 | Capacitor, 47 pF, 0603 | 40061-048 | 0 | |
| 9 | Capacitor, 0.1 uF, 25 V (0603) | 40061-042 | 32 | C3–C6,C8–C31,C51–C52,C60–C61 |
| 10 | Header, 2x1 | 63011-002 | 1 | J2 |
| 11 | Connector, 2x15 Edge | 0-063131-002 | 1 | J3 |
| 12 | Resistor, 33,0603 | 40122-330 | 2 | R1,R4 |
| 13 | Resistor, 10k,0603 | 40122-103 | 21 | R2–R3,R5–R22,R44 |
| 14 | Resistor, 1k,0603 | 40122-102 | 0 | |
| 15 | Resistor, 4.7k,0603 | 40122-472 | 0 | |
| 16 | Resistor, 110,0603 | 40122-111 | 19 | R36–R43,R47,R49,R54–R62 |
| 17 | Resistor, 0,0603 | 40122-000 | 1 | R5 |
| 18 | Processor, 60960JA | 45149-002 | 1 | U1 |
| 19 | Processor, 80960JD | 45149-003 | 0 | |
| 20 | Programmed Logic | 1-048C02-005 | 1 | U2 |
| 21 | Programmed Logic | 1-048C02-006 | 1 | U3 |
| 22 | DRAM, 256kx16 | 45099-006 | 1 | U5 |
| 23 | Programmed PROM (TRSA) | 1-048C02-008 | 0 | |
| 24 | Programmed PROM (TRA) | 1-048C02-010 | 0 | |
| 25 | Programmed PROM (ENSA) | 1-048002-011 | 1 | U6 |
| 26 | Programmed PROM (ENA) | 1-048002-013 | 0 | |
| 27 | Oscillator, 32 MHz | 45116-419 | 1 | U9 |
| 28 | Dual 4 to 1 Mux/Demux | 0-45208-001 | 1 | U11 |
| 29 | Octal Bus Transceiver, soic wb | 45085-245 | 0 | |
| 30 | Programmed Logic | 1-048002-003 | 0 | |
| 31 | Programmed Logic | 1-048002-004 | 0 | |
| 32 | Token Ring MAC | 0-045211 | 0 | |
| 33 | Token Ring Accelator | 0-045210 | 0 | |
| 34 | Programmed Logic | 1-048002-007 | 1 | U21 |
| 35 | Programmed PROM (TRSB) | 1-048002-009 | 0 | |
| 36 | Programmed PROM (ENSB) | 1-048002-012 | 1 | U22 |
| 37 | Quad 2 to 1 Mux,soic nb | 45085-157 | 0 | |

-continued

| Item | Description | Part Number | Quantity | Reference Designation |
|---|---|---|---|---|
| 38 | Ferrite Bead, SMT | 40110-001 | 2 | Z1–Z2 |
| 39 | Label, MAC Address | 1-053022-001 | 0 | |
| 40 | Label, MAC Address | 1-053022-002 | 1 | |
| 41 | Label, Serial Number | 51043-004 | 1 | |

| Item | Description | Part Number | Quantity -004 | Ethernet Standard Management Reference Designation |
|---|---|---|---|---|
| 1 | Printed Circuit Board, MPM | 1-026004-001 | 1 | |
| 2 | Support Bracket, Vert. Interconnect | 058001-001 | 1 | |
| 3 | Rivit | 0-055054-002 | 2 | |
| 4 | Socket, 32 pin PLCC | 63068-003 | 2 | |
| 5 | Connector, 72 pin SIMM | 7-382487-2 | 1 | |
| 6 | Shorting Strap | 63012-102 | 1 | |
| 7 | Capacitor, Tantalum, 4.7 uF, 3528 | 40062-010 | 1 | C1 |
| 8 | Capacitor, 47 pF, 0603 | 40061-048 | 0 | |
| 9 | Capacitor, 0.1 uF, 25 V (0603) | 40061-042 | 32 | C3–C6,C8–C31,C51–C52,C60–C61 |
| 10 | Header, 2x1 | 63011-002 | 1 | J2 |
| 11 | Connector, 2x15 Edge | 0-063131-002 | 1 | J3 |
| 12 | Resistor, 33,0603 | 40122-330 | 2 | R1,R4 |
| 13 | Resistor, 10k,0603 | 40122-103 | 21 | R2–R3,R5–R22,R44 |
| 14 | Resistor, 1k,0603 | 40122-102 | 0 | |
| 15 | Resistor, 4.7k,0603 | 40122-472 | 0 | |
| 16 | Resistor, 110,0603 | 40122-111 | 19 | R36–R43,R47,R49,R54–R62 |
| 17 | Resistor, 0,0603 | 40122-000 | 0 | |
| 18 | Processor, 60960JA | 45149-002 | 0 | |
| 19 | Processor, 80960JD | 45149-003 | 1 | U1 |
| 20 | Programmed Logic | 1-048C02-005 | 1 | U2 |
| 21 | Programmed Logic | 1-048C02-006 | 1 | U3 |
| 22 | DRAM, 256kx16 | 45099-006 | 2 | U4–U5 |
| 23 | Programmed PROM (TRSA) | 1-048C02-008 | 0 | |
| 24 | Programmed PROM (TRA) | 1-048C02-010 | 0 | |
| 25 | Programmed PROM (ENSA) | 1-048002-011 | 0 | |
| 26 | Programmed PROM (ENA) | 1-048002-013 | 1 | U6 |
| 27 | Oscillator, 32 MHz | 45116-419 | 1 | U9 |
| 28 | Dual 4 to 1 Mux/Demux | 0-45208-001 | 1 | U11 |
| 29 | Octal Bus Transceiver, soic wb | 45085-245 | 0 | |
| 30 | Programmed Logic | 1-048002-003 | 0 | |
| 31 | Programmed Logic | 1-048002-004 | 0 | |
| 32 | Token Ring MAC | 0-045211 | 0 | |
| 33 | Token Ring Accelator | 0-045210 | 0 | |
| 34 | Programmed Logic | 1-048002-007 | 1 | U21 |
| 35 | Programmed PROM (TRSB) | 1-048002-009 | 0 | |
| 36 | Programmed PROM (ENSB) | 1-048002-012 | 0 | |
| 37 | Quad 2 to 1 Mux,soic nb | 45085-157 | 0 | |
| 38 | Ferrite Bead, SMT | 40110-001 | 2 | Z1–Z2 |
| 39 | Label, MAC Address | 1-053022-001 | 0 | |
| 40 | Label, MAC Address | 1-053022-002 | 1 | |
| 41 | Label, Serial Number | 51043-004 | 1 | |

What is claimed is:

1. An expansion module to connect additional communication ports to a hub of a communications network comprising:

an enclosure containing additional communication ports on a motherboard, a hub receiving portion on an exterior of the enclosure to mount to a hub of a communications network, a mating interconnection board to electrically connect with a first electrical connector on the hub when the enclosure is mounted to the hub, whereby the additional communication ports are connected to communications network circuitry in the hub, a hub connection cavity in the enclosure, the mating interconnection board being connected to the motherboard and facing the hub connection cavity, an interconnection board carrying a second electrical connector, an expansion port opening in the enclosure, the second electrical connector facing the expansion port opening for connection to a duplicate expansion module containing additional communication ports and a mating interconnection board for connection to the second electrical connector, when a duplicate expansion module is mounted over the expansion port opening in the enclosure.

2. An expansion module to connect additional communication ports to a hub of a communications network comprising:

an enclosure containing additional communication ports on a motherboard, a hub receiving portion on an exterior of the enclosure to mount to a hub of a communications network, a mating interconnection board to electrically connect with a first electrical connector on the hub, when the enclosure is mounted to the hub, a hub connection cavity in the enclosure, the mating interconnection board being connected to the motherboard and facing the hub connection cavity, card guides in the enclosure, the card guides being adjacent the hub connection cavity, a second electrical connector on the motherboard facing the hub connection cavity, and the mating interconnection board being slidable along the card guides for plugged connection with the second electrical connector.

3. An expansion module for connecting additional communication ports to a hub of a communications network comprising: additional communications ports on the expansion module, a mating expansion port opening in the expansion module for facing an expansion port opening in the hub when the expansion module is against the hub, a mating interconnection board that aligns and mates with a electrical connector on the hub when the expansion module is against the hub, and the mating interconnection board being parallel to rails on the expansion module, which rails slidably engage with the hub.

4. An expansion module as recited in claim 3, and further comprising:
the communication ports and the mating interconnection board mount to a motherboard in the expansion module.

5. An expansion module as recited in claim 3, and further comprising:
the communication ports and the mating interconnection board mount to a motherboard in the expansion module, and the motherboard is a duplicate of a motherboard in the hub.

6. An expansion module to connect additional communication ports to a hub of a communications network comprising:
additional communications ports on the expansion module to connect with a communications network,
a connection cavity in the expansion module to face an expansion port opening in the hub when the expansion module is against the hub,
a mating interconnection board of the expansion module that aligns and mates with a electrical connector on the hub when the expansion module is against the hub,
an interconnection board facing an expansion port opening in the expansion module to face a connection cavity in a duplicate expansion module, when the expansion module is against the duplicate expansion module,
and an interconnection board with a electrical connector facing the expansion port opening in the expansion module to connect with a mating interconnection board on the duplicate expansion module.

7. An expansion module as recited in claim 6 wherein, card guides in the expansion module are adjacent the expansion port opening in the expansion module,
a electrical connector in the expansion module faces the expansion port opening in the expansion module, and
an interconnection board being slidable along the card guides for plugged connection with a electrical connector in the duplicate expansion module.

8. An expansion module as recited in claim 6 wherein, the connection cavity in the expansion module is adjacent to a mesa receiving cavity in the expansion module to receive a raised mesa on the hub.

9. An expansion module as recited in claim 6 and further comprising: a raised mesa on the expansion module to be received in a mesa receiving cavity in the duplicate expansion module, and the expansion port opening in the expansion module being adjacent to the mesa.

10. An expansion module as recited in claim 6 wherein, sliding rails on the expansion module slidably engage with the hub and prealign the mating interconnection board along an axis of mating with the electrical connector on the hub.

11. An expansion module as recited in claim 6 wherein, pivotable latches on the expansion module lock to the base hub.

12. An expansion module as recited in claim 6 wherein, sliding rails on the expansion module slidably engage with the hub and prealign the mating interconnection board along an axis of mating with the electrical connector on the hub, and pivotable latches on the expansion module lock to the hub.

13. An expansion module as recited in claim 6 wherein, the connection cavity in the expansion module is encircled by a shroud, and electrical shielding is on the shroud.

14. An expansion module as recited in claim 6 wherein, the connection cavity in the expansion module is encircled by electrical shielding.

15. An expansion module to connect additional communication ports to a hub of a communications network comprising:
the expansion module containing additional communication ports,
a mating interconnection board connected by circuitry to the additional communication ports,
the mating interconnection board being moveable along an axis of mating to mate with circuitry in the hub of a communications network, when the expansion module is mounted to the hub, and
tracks on the expansion module extending parallel to the axis of mating, the tracks being engageable with the hub, the mating interconnection board being aligned along the axis of mating by engagement of the tracks with the hub, and the expansion module being restrained in movement relative to the hub by engagement of the tracks with the hub.

16. An expansion module as recited in claim 15 wherein, the mating interconnection board is adjacent to a connection cavity in the expansion module.

17. An expansion module as recited in claim 16 wherein, the connection cavity is adjacent to a mesa receiving cavity in the expansion module to receive a raised mesa on the hub.

18. An expansion module as recited in claim 16 wherein, the connection cavity in the expansion module is encircled by a shroud, and electrical shielding is on the shroud.

19. An expansion module as recited in claim 16 wherein, the connection cavity in the expansion module is encircled by electrical shielding.

20. An expansion module as recited in claim 15 and further comprising: an expansion port opening in the expansion module, an electrical connector exposed at the expansion port opening to mate with another mating interconnection board of a duplicate expansion module, and further tracks on the expansion module to align and restrain movement of the duplicate expansion module relative to an axis of mating of the electrical connector with said another mating interconnection board.

21. An expansion module as recited in claim 15 wherein, pivotable latches on the expansion module lock to the hub of a communications network.

22. An expansion module to connect additional communication ports to a hub of a communications network comprising:
an enclosure containing additional communication ports,
a mating interconnection board connected by circuitry to the additional communication ports,
the mating interconnection board being moveable along an axis of mating to mate with circuitry in the hub of a communications network, when the enclosure is mounted to the hub, and
tracks on the enclosure extending parallel to the axis of mating, the tracks being engageable with the hub, the mating interconnection board being aligned along the axis of mating by engagement of the tracks with the hub, and the enclosure being restrained in movement relative to the hub by engagement of the tracks with the hub.

* * * * *